United States Patent
Sotiropoulos et al.

(10) Patent No.: US 12,411,415 B2
(45) Date of Patent: Sep. 9, 2025

(54) LITHOGRAPHIC APPARATUS AND METHOD FOR ILLUMINATION UNIFORMITY CORRECTION

(71) Applicant: ASML Netherlands B.V., Veldhoven (NL)

(72) Inventors: Nikolaos Sotiropoulos, Eindhoven (NL); Albertus Hartgers, Berkel-Enschot (NL); Michael Frederik Ypma, Zaltbommel (NL); Marco Matheus Louis Steeghs, Sevenum (NL)

(73) Assignee: ASML Netherlands B.V., Veldhoven (NL)

( * ) Notice: Subject to any disclaimer, the term of this patent is extended or adjusted under 35 U.S.C. 154(b) by 142 days.

(21) Appl. No.: 18/282,246

(22) PCT Filed: Feb. 24, 2022

(86) PCT No.: PCT/EP2022/054615
§ 371 (c)(1),
(2) Date: Sep. 15, 2023

(87) PCT Pub. No.: WO2022/199969
PCT Pub. Date: Sep. 29, 2022

(65) Prior Publication Data
US 2024/0160108 A1    May 16, 2024

(30) Foreign Application Priority Data
Mar. 25, 2021   (EP) ..................................... 21164836

(51) Int. Cl.
*G03F 7/00*    (2006.01)

(52) U.S. Cl.
CPC ...... *G03F 7/70141* (2013.01); *G03F 7/70066* (2013.01); *G03F 7/70525* (2013.01); *G03F 7/7085* (2013.01); *G03F 7/70891* (2013.01)

(58) Field of Classification Search
CPC ............ G03F 7/70891; G03F 7/70191; G03F 7/70141; G03F 7/70525; G03F 7/705; G03F 7/702
See application file for complete search history.

(56) References Cited

U.S. PATENT DOCUMENTS

| 5,390,227 A * | 2/1995 | Mizusawa ........... G03F 7/70066 |
| | | 378/150 |
| 7,532,308 B2 * | 5/2009 | Bouman ............. G03F 7/70891 |
| | | 355/71 |

(Continued)

FOREIGN PATENT DOCUMENTS

| DE | 10 2009 030230 A1 | 12/2010 | |
| WO | WO-2018188859 A1 * | 10/2018 | ............ G01J 1/4257 |

OTHER PUBLICATIONS

International Search Report and Written Opinion of the International Searching Authority directed to International Patent Application No. PCT/EP2022/054615, mailed May 23, 2022; 11 pages.

(Continued)

*Primary Examiner* — Steven H Whitesell
(74) *Attorney, Agent, or Firm* — Sterne, Kessler, Goldstein &Fox P.L.L.C.

(57) ABSTRACT

A lithographic apparatus comprising an illumination system configured to condition a radiation beam and a uniformity correction system configured to adjust an intensity profile of the radiation beam. The lithographic apparatus comprises a control system configured to control the uniformity correc- (Continued)

tion system at least partially based on a thermal status criterion that is indicative of a thermal state of a part of the lithographic apparatus.

13 Claims, 5 Drawing Sheets

(56) References Cited

U.S. PATENT DOCUMENTS

| | | |
|---|---|---|
| 8,629,973 B2 | 1/2014 | Zimmerman et al. |
| 10,935,673 B2* | 3/2021 | Van De Kerkhof ..... G01K 5/48 |
| 2005/0128446 A1* | 6/2005 | Miyajima ........... G03F 7/70891 |
| | | 355/30 |
| 2009/0073404 A1* | 3/2009 | Muramatsu ......... G03F 7/70466 |
| | | 430/311 |
| 2010/0302525 A1* | 12/2010 | Zimmerman ....... G03F 7/70191 |
| | | 355/71 |
| 2011/0205516 A1 | 8/2011 | De Vries et al. |
| 2012/0229787 A1* | 9/2012 | Van Schoot ....... G02B 26/0833 |
| | | 355/71 |
| 2012/0262685 A1 | 10/2012 | Zimmerman |
| 2013/0077064 A1* | 3/2013 | Ehm ................... G03F 7/70891 |
| | | 355/30 |
| 2015/0212425 A1 | 7/2015 | Chieda et al. |
| 2016/0062244 A1 | 3/2016 | Patra |
| 2020/0133142 A1 | 4/2020 | Lu et al. |

OTHER PUBLICATIONS

International Preliminary Report on Patentability directed to International Patent Application No. PCT/EP2022/054615, issued Sep. 12, 2023; 8 pages.

* cited by examiner

LITHOGRAPHIC APPARATUS AND METHOD FOR ILLUMINATION UNIFORMITY CORRECTION

CROSS-REFERENCE TO RELATED APPLICATIONS

This application claims priority of EP application 21164836.5 which was filed on 25 Mar. 2021, and which is incorporated herein in its entirety by reference.

FIELD

The present invention relates to a lithographic apparatus comprising an illumination uniformity correction system and an associated method. The present invention generally relates to lithography, and more particularly to a system and method for compensating for uniformity drift caused by thermal effects.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a reticle or mask) onto a layer of radiation-sensitive material (resist) provided on a substrate.

To project a pattern on a substrate a lithographic apparatus may use electromagnetic radiation. The wavelength of this radiation determines the minimum size of features that can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

A lithographic apparatus typically includes an illumination system, which is arranged to condition radiation generated by a radiation source before the radiation is incident upon a patterning device. The illumination system may, for example, modify one or more properties of the radiation, such as polarization and/or illumination mode. The illumination system may include a uniformity correction system, which is arranged to correct or reduce non-uniformities, e.g., intensity non-uniformities, present in the radiation. The uniformity correction system may, for example, employ actuated fingers that are inserted into an edge of a radiation beam to correct intensity variations.

In order to ensure good imaging quality on the patterning device and the substrate, a controlled uniformity of the radiation beam is maintained. That is, the radiation beam before reflecting from or transmitting through the patterning device potentially has a non-uniform intensity profile. It is desirable to the entire lithographic process that the radiation beam be controlled with at least some uniformity. Uniformity can refer to a constant intensity across the entire radiation beam, but can also refer to the ability to control the illumination to a target illumination uniformity. The target illumination uniformity may have a flat or a non-flat profile. The patterning device imparts to a beam of radiation a pattern, which is then imaged onto a substrate. Image quality of this projected radiation beam is affected by the uniformity of the radiation beam. Compensating for system drift is typically performed once per substrate lot. A substrate lot may consist of between twenty and thirty substrates, e.g. twenty-five substrates. Known uniformity correction systems and methods are utilized in between about 300 ms and about 600 ms between exposures of subsequent substrate lots.

It is desirable to provide a uniformity correction system and method that reduces a radiation beam's non-uniformity with respect to a target illumination profile while reducing any negative effects on substrate throughput. It is an aim of the present disclosure to provide a lithographic apparatus and method for illumination uniformity correction that addresses one or more problems, whether identified herein or elsewhere, or at least provides a useful alternative.

SUMMARY

It is an object of the present disclosure to provide an improved concept of a lithographic apparatus and method for illumination uniformity correction. This object is achieved with the subject matter of the independent claims. Further aspects of the improved concept are the subject matter of the dependent claims.

According to a first aspect of the present disclosure, there is provided a lithographic apparatus comprising an illumination system configured to condition a radiation beam. The lithographic apparatus comprises a uniformity correction system configured to adjust an intensity profile of the radiation beam. The lithographic apparatus comprises a control system configured to control the uniformity correction system at least partially based on a thermal status criterion that is indicative of a thermal state of a part of the lithographic apparatus.

The lithographic apparatus may comprise a support device, a substrate table, and a projection system. The support device may be configured to hold a patterning device configured to impart the radiation beam with a pattern in its cross-section to form a patterned radiation beam. The substrate table may be configured to hold a substrate. The projection system may be configured to project the patterned radiation beam onto a target portion of the substrate.

The illumination system may be arranged to condition the radiation generated by a radiation source before the radiation beam is incident upon the patterning device. The illumination system may be configured to modify one or more properties of the radiation beam, such as a polarization and/or illumination mode of the radiation beam.

The uniformity correction system may form part of the illumination system. The uniformity correction system may be arranged to correct or reduce non-uniformities, e.g., intensity non-uniformities, present in the radiation beam. The uniformity correction system may comprise fingers configured to be movable into and out of intersection with the radiation beam to adjust (e.g. correct) an intensity of respective portions of the radiation beam. The uniformity correction system may comprise actuating devices coupled to one or more of the fingers and configured to move the corresponding fingers.

Changes in the thermal state (e.g. temperature) of one or more parts of the lithographic apparatus may cause unwanted changes in the intensity profile (e.g. a slit uniformity) of the radiation beam. Unwanted changes in the intensity profile of the radiation beam may result in lithographic errors, such as negatively influencing a critical dimension uniformity of the lithographic apparatus. Lithographic errors may result in incorrect patterns being formed on a substrate, which in turn may lead to faulty devices being manufactured by the lithographic apparatus. The control system advantageously uses the thermal status criterion to monitor (e.g. directly and/or indirectly measure and/or estimate) and/or predict the temperature and/or a change in temperature of the part of the lithographic apparatus. The control system uses the thermal criterion to control the uniformity correction system and thereby at least partially account for any unwanted changes in the intensity profile of the radiation beam caused by thermal effects. The control system advantageously reduces lithographic errors without unduly reducing a throughput of the lithographic apparatus.

The thermal status criterion may be indicative of the thermal state of a part of the lithographic apparatus that directly or indirectly receives heat generated by the radiation beam. The thermal status criterion may comprise a temperature of the part of the lithographic apparatus. The thermal status criterion may comprise a parameter that is correlative to a temperature of the part of the lithographic apparatus. The thermal status criterion may comprise pre-determined and/or monitored radiation dose information. The thermal status criterion may comprise pre-determined and/or monitored radiation pulse information. The temperature may be an absolute temperature. The temperature may be a relative temperature. For example, the temperature may be relative to one or more other parts of the lithographic apparatus at the same time or at different times. As another example, the temperature may be relative to a pre-determined reference temperature.

The control system may be a feedforward control system. A feedback control system may be thought of as a control system for which an output depends on a generated feedback signal. A feedforward control system may be thought of as a system that passes a signal to an external load and rejects disturbances before the disturbances affect the controlled variable. That is, in feedback control, a variable is adjusted based on errors. In feedforward control, the variable is adjusted based on knowledge of a parameter (e.g. the thermal status criterion) that may lead to errors.

The control system may be a dynamic control system. That is, the control system may proactively react to changing parameters rather than simply applying a static control regime that does not adjust to changing parameters. In other words, static control systems cannot react to the specific thermal conditions that affect imaging performance during a lithographic exposure. A fixed number of static uniformity correction events may be added during exposure of a substrate lot, but this negatively affects a throughput of the lithographic apparatus because the additional compensations are performed for all substrate lots as per a static control regime. The dynamic control system advantageously triggers dynamic uniformity correction events only when they are needed, thereby reducing lithographic errors whilst keeping a negative impact on throughput to a minimum.

The control system may be configured to control the uniformity correction system at least partially based on a comparison between the thermal status criterion and a reference thermal status criterion.

The reference thermal status criterion may comprise a reference temperature of the part of the lithographic apparatus. The reference thermal status criterion may comprise a reference parameter that is correlative to a temperature of the part of the lithographic apparatus. The reference thermal status criterion may be determined by performing a calibration to determine a relationship between the intensity profile of the radiation beam and the thermal status criterion.

The reference thermal status criterion may comprise a pre-determined limit. The control system may be configured to cause the uniformity correction system to adjust the intensity profile of the radiation beam when the thermal status criterion reaches the pre-determined limit.

The thermal status criterion may comprise a predicted component.

The predicted component may be calculated at least partially based on pre-determined lithographic exposure information.

The lithographic exposure information may comprise radiation dose information. The lithographic exposure information may comprise radiation pulse information.

The thermal status criterion may comprise a monitored component.

The lithographic apparatus may comprise a sensing system configured to measure a temperature of the part of the lithographic apparatus. The monitored component may comprise a measurement performed by the sensing system.

The lithographic apparatus may comprise a cooling system configured to provide a flow of coolant for cooling the part of the lithographic apparatus. The sensing system may be configured to measure a temperature of the coolant.

The cooling system may be configured to cool a mirror array of the lithographic apparatus.

The lithographic apparatus may comprise an optical element configured to interact with the radiation beam. The lithographic apparatus may comprise a support structure configured to support the optical element. The sensing system may be configured to measure a temperature of the optical element and/or the support structure.

The lithographic apparatus may comprise a support device configured to hold a patterning device. The patterning device may be configured to impart the radiation beam with a pattern in its cross-section to form a patterned radiation beam. The lithographic apparatus may comprise a reticle-masking blade system configured to selectively block the patterned radiation beam. The sensing system may be configured to measure a temperature of the support device and/or the reticle-masking blade system.

The lithographic apparatus may comprise a measurement system configured to measure a thermal deformation of the part of the lithographic apparatus. The monitored component may comprise a measurement performed by the measurement system.

Thermal deformation may comprise a thermal expansion of the part of the lithographic apparatus. Thermal deformation may comprise a thermal contraction of the part of the lithographic apparatus.

The measurement system may comprise a reflective surface and an arm which extends from a surface opposite to the reflective surface. The measurement system may comprise a support frame provided with a sensing apparatus configured to measure a gap between the sensing apparatus and the arm. The monitored component may comprise the gap measured by the measurement system.

The reflective surface may form part of a mirror array. The mirror array may form part of the illumination system. The mirror array may be a field facet mirror array.

The sensing apparatus may be configured to measure a gap between the sensing apparatus and an end of the arm. A magnet and/or an inductive material may be provided at the end of the arm. The sensing apparatus may comprise an eddy current sensor.

The measurement system may comprise a reflector configured to reflect at least a portion of the radiation beam. The measurement system may comprise a sensor configured to measure a position of the reflected portion of the radiation beam. The monitored component may comprise the position of the reflected portion of the radiation beam measured by the measurement system.

The measurement system may comprise a processor configured to determine an alignment between the illumination system and a source of the radiation beam at least partially based on the detected position of the portion of the reflected radiation beam.

The monitored component may comprise lithographic exposure information.

The lithographic exposure information may comprise radiation dose information. The lithographic exposure information may comprise radiation pulse information.

The control system may be configured to use the thermal status criterion to control the uniformity correction system during a lithographic exposure of a substrate.

According to a second aspect of the present disclosure, there is provided a method of controlling a radiation beam for lithography. The method comprises conditioning a radiation beam and adjusting an intensity profile of the radiation beam at least partially based on a thermal status criterion that is indicative of heat generated by the radiation beam.

The method may comprise comparing the thermal status criterion to a reference thermal status criterion. The method may comprise adjusting the intensity profile of the radiation beam at least partially based on the comparison.

The reference thermal status criterion may comprise a pre-determined limit. The method may comprise adjusting the intensity profile of the radiation beam when the thermal status criterion reaches the pre-determined limit.

The thermal status criterion may comprise a predicted component.

The predicted component may be calculated at least partially based on pre-determined lithographic exposure information.

The thermal status criterion may comprise a monitored component.

The monitored component may comprise a temperature measurement and/or a thermal deformation measurement.

The monitored component may comprise lithographic exposure information.

The method may comprise determining a relationship between the intensity profile of the radiation beam and the thermal status criterion. The method may comprise using the relationship to determine a reference thermal status criterion. The method may comprise adjusting the intensity profile of the radiation beam at least partially based on the reference thermal status criterion.

A method of projecting a patterned beam of radiation onto a substrate may comprise the method of the second aspect of the present disclosure.

A computer program may comprise computer readable instructions configured to cause a computer to carry out a method according to the second aspect of the present disclosure. A computer readable medium may carry the computer program A computer apparatus may comprise a memory storing processor readable instructions, and a processor arranged to read and execute instructions stored in said memory. The processor readable instructions may comprise instructions arranged to control the computer to carry out a method according to the second aspect of the present disclosure.

BRIEF DESCRIPTION OF THE DRAWINGS

The following description of figures of exemplary embodiments may further illustrate and explain aspects of the improved concept. Components and parts of the lithographic apparatus with the same structure and the same effect appear with equivalent reference symbols. Insofar as components and parts of the lithographic apparatus correspond to one another in terms of their function in different figures, the description thereof is not repeated for each of the following figures.

Embodiments of the invention will now be described, by way of example only, with reference to the accompanying schematic drawings, in which.

DETAILED DESCRIPTION

Figure 1:
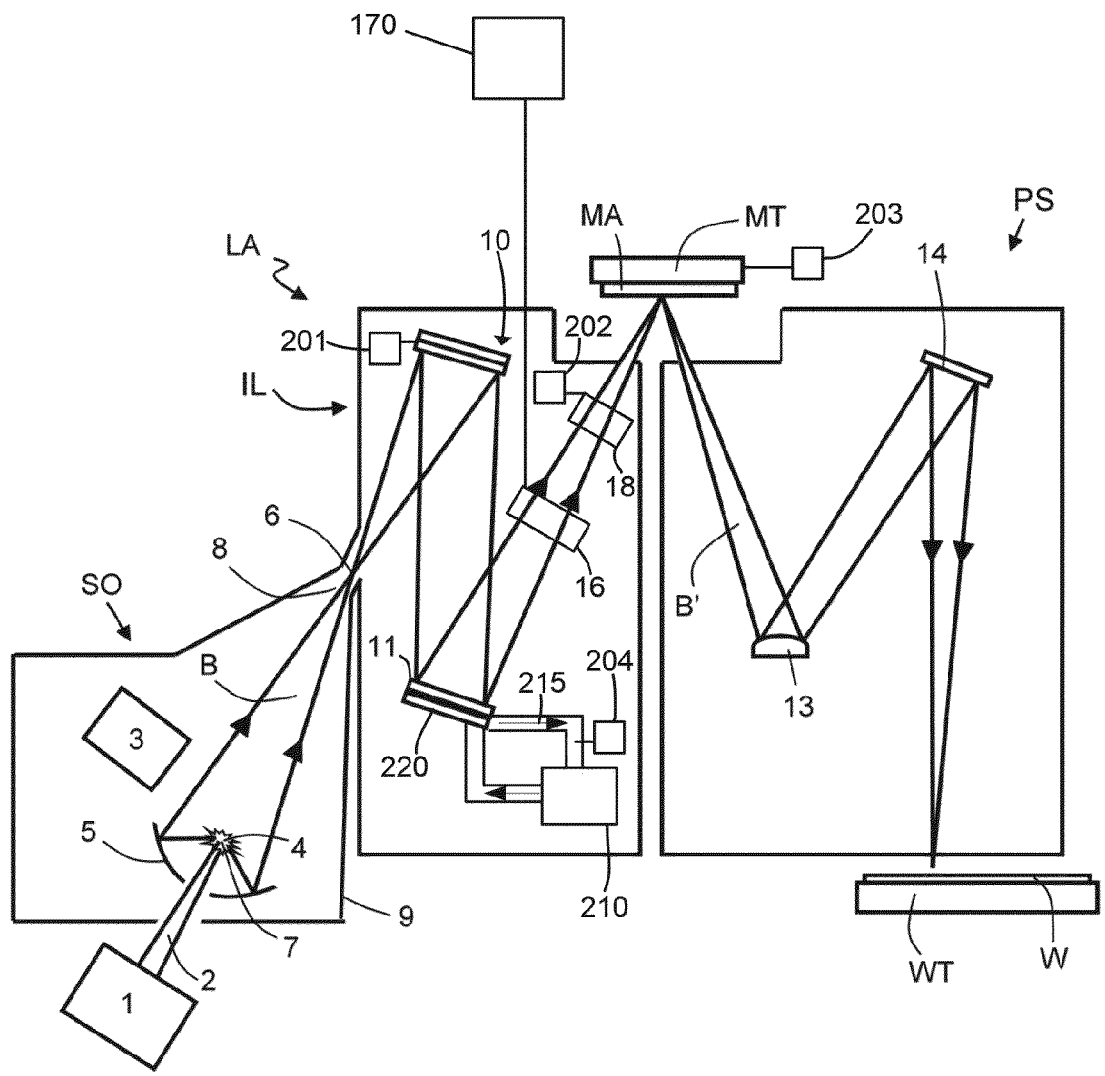
FIG. 1 schematically depicts a lithographic system comprising a radiation source and a lithographic apparatus comprising a uniformity correction system and control system in accordance with the present disclosure.

FIG. 1 shows a lithographic system comprising a radiation source SO and a lithographic apparatus LA comprising a uniformity correction system 16 and control system 170 in accordance with the present disclosure. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a reticle or mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 is a mirror array made up of individually controllable mirrors. A mirror of the array together with an associated actuator and sensing apparatus (which are described in greater detail below) may be referred to as a mirror assembly. A controller (not shown) controls the orientations of the mirrors (as is described further below). The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11. The illumination system IL comprises a reticle-masking blade system 18. The reticle-masking blade system 18 comprises a pair of blades that are moveable in a scanning direction of the lithographic apparatus LA. The reticle-masking blade system 18 may be used to ensure that, during exposure of a given target area, radiation is not incident upon a target area that is adjacent in the y- and/or x-direction to the given target area.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of four or eight may be applied. Although the projection system PS is illustrated as having only two mirrors 13, 14 in FIG. 1, the projection system PS may include a different number of mirrors (e.g., six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO shown in FIG. 1 is, for example, of a type which may be referred to as a laser produced plasma (LPP) source. A laser system 1, which may, for example, include a $CO_2$ laser, is arranged to deposit energy via a laser beam 2 into a fuel, such as tin (Sn) which is provided from, e.g., a fuel emitter 3. Although tin is referred to in the following description, any suitable fuel may be used. The fuel may, for example, be in liquid form, and may, for example, be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a tin plasma 7 at the plasma formation region 4. Radiation, including EUV radiation, is emitted from the plasma 7 during de-excitation and recombination of electrons with ions of the plasma.

The EUV radiation from the plasma is collected and focused by a collector 5. The collector 5 comprises, for example, a near-normal incidence radiation collector 5 (sometimes referred to more generally as a normal-incidence radiation collector). The collector 5 may have a multilayer mirror structure that is arranged to reflect EUV radiation (e.g., EUV radiation having a desired wavelength such as 13.5 nm). The collector 5 may have an ellipsoidal configuration, having two focal points. A first one of the focal points may be at the plasma formation region 4, and a second one of the focal points may be at an intermediate focus 6, as discussed below.

The laser system 1 may be spatially separated from the radiation source SO. Where this is the case, the laser beam 2 may be passed from the laser system 1 to the radiation source SO with the aid of a beam delivery system (not shown) comprising, for example, suitable directing mirrors and/or a beam expander, and/or other optics. The laser system 1, the radiation source SO and the beam delivery system may together be considered to be a radiation system.

Radiation that is reflected by the collector 5 forms the EUV radiation beam B. The EUV radiation beam B is focused at intermediate focus 6 to form an image at the intermediate focus 6 of the plasma present at the plasma formation region 4. The image at the intermediate focus 6 acts as a virtual radiation source for the illumination system IL. The radiation source SO is arranged such that the intermediate focus 6 is located at or near to an opening 8 in an enclosing structure 9 of the radiation source SO.

Although FIG. 1 depicts the radiation source SO as a laser produced plasma (LPP) source, any suitable source such as a discharge produced plasma (DPP) source or a free electron laser (FEL) may be used to generate EUV radiation.

The illumination system IL comprises a uniformity correction system 16. In one example, the uniformity correction system 16 is located before the reticle-masking blade system 18 in the path of the radiation beam B, so that the radiation beam can pass through the uniformity correction system 16 before the radiation beam is incident upon the reticle-masking blade system 18. The uniformity correction system 16 may be configured to spatially control an intensity of the radiation beam B. That is, the uniformity correction system 16 may be configured to spatially control an intensity profile of the radiation that will be projected onto the substrate W. The uniformity correction system 16 may be placed in or proximate a field plane of illumination system IL. In an embodiment, the uniformity correction system 16 includes at least one array of overlapping fingers (e.g., bank of fingers 22, 23 depicted in FIG. 2A) and/or at least one array of non-overlapping fingers. The fingers are movable into and out of intersection with a radiation beam that is incident on the fingers to selectively correct an intensity of portions of the radiation beam. It is to be appreciated that although seven fingers are shown in each bank in the example of FIG. 2A, any number of fingers can be used. The term of bank of fingers, finger bank or bank may be used interchangeably throughout the present application.

The lithographic apparatus LA comprises a control system 170 configured to control the uniformity correction system 16. The control system 170 may be configured to determine adjustments to the fingers (shown in FIG. 2A) of the uniformity correction system 16 such that a desired uniformity specification is met. The control system 170 may be configured to determine one or more correction parameters based on the determined adjustments and communicate these parameters to the uniformity correction system 16. The correction parameters may control adjustable variables within the uniformity correction system 16. The control system 170 may receive illumination field data collected from one or more uniformity measurement devices (not shown). Through manipulation of the adjustable variables of the uniformity correction system 16 in accordance with the correction parameters, characteristics of the radiation beam B may be changed. More specifically, the correction parameters may provide details on how to adjust the variables of the uniformity correction system 16 to achieve the desired uniformity profile (e.g., flattest uniformity or shape beneficial for the lithography process). For example, correction parameters may describe which fingers in one or more banks of fingers (e.g., bank of fingers 22, 23 in FIG. 2A) need to be moved and to what distance they need to moved into or out of intersection with an incident beam of radiation so as to selectively correct an intensity of portions of the radiation beam incident on the uniformity correction system 16.

The control system 170 may include one or more processors and memory. One or more processors can execute software that causes the uniformity correction system 16 to adjust variables to achieve a desired uniformity criteria for the radiation beam. Computer programs may be stored in the memory. Such computer programs, when executed, may allow a processor in the control system 170 to perform the features of an embodiment of the present disclosure as discussed herein. When a method for controlling the uniformity correction system 16 is implemented using software, the software may be stored in a computer program product and loaded into the control system 170 using a removable storage device, a hard drive, or a communications interface. Alternatively, the computer program product may be downloaded to the control system 170 via a communications path. The control system 170 may be coupled to one or more remote processors. The control system 170 may receive and/or send instructions and/or operating parameters remotely.

Figure 2A:
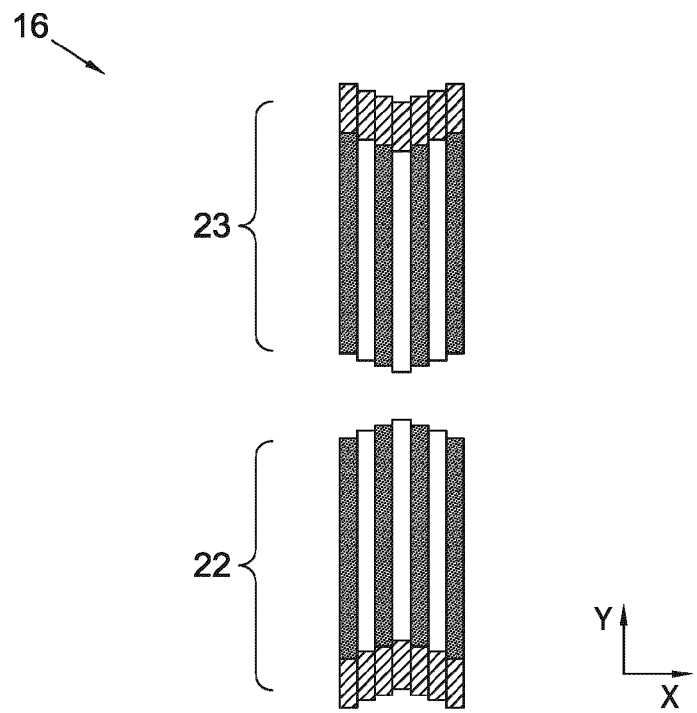
FIG. 2A schematically depicts a uniformity correction system, and FIGS. 2B and 2C schematically depict an effect of using the uniformity correction system of FIG. 2A.
Figures 2B, 2C:
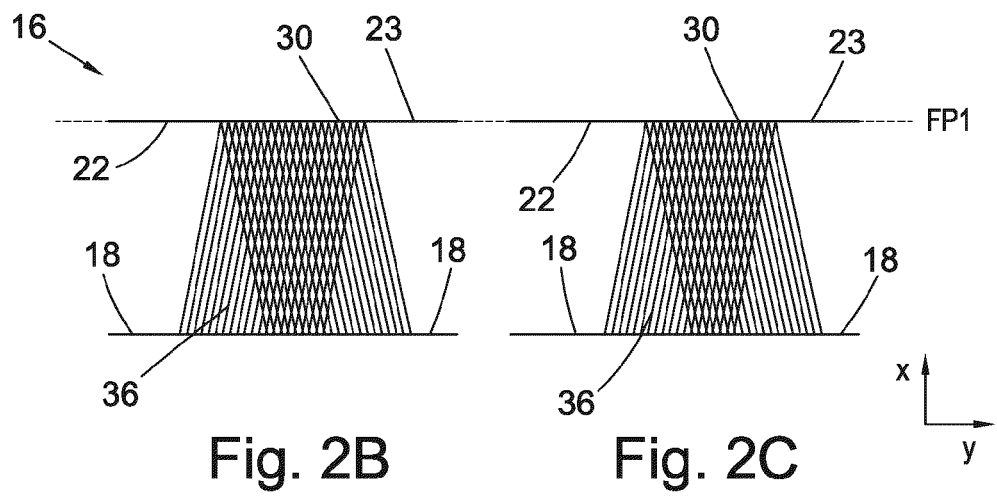

FIG. 2A schematically depicts a uniformity correction system 16, and FIGS. 2B and 2C schematically depict an effect of using the uniformity correction system 16 of FIG. 2A. The uniformity correction system 16 may comprise two banks of fingers 22 and 23 that are moveable in the Y direction such that they intersect the radiation beam. In this way, the fingers 22, 23 may be used to selectively block incident radiation. This may be done, for example, to reduce the intensity of radiation in a location of the radiation beam field in which the radiation intensity is too high. The fingers 22, 23 may be coupled to an actuating device (not shown). The actuating device may be configured to move the fingers 22, 23 in the Y direction. The actuating device may comprise one or more of a motor, a piezoelectric device, a hydraulic device, or the like.

FIGS. 2B and 2C show a cross-section of the uniformity correction system 16. In the example of FIGS. 2B and 2C, the banks of fingers 22 and 23 of the uniformity correction system 16 are located in a field plane FP1 of the lithographic apparatus. In this plane FP1, a radiation beam 36 comprises an array of virtual sources 30. At the reticle-masking blades 18, the radiation beam 36, which is represented by a plurality of sub-beams, is diverging. In the example in FIG. 2B, fingers in the banks of fingers 22, 23 are positioned such that they do not intersect with the radiation beam 36. In FIG. 2C, the fingers in the banks of fingers 22, 23 have been moved in the Y direction such that they intersect with the radiation beam 36. An intensity profile of the beam of radiation 36 is adjusted by selectively moving one or more fingers in banks of fingers 22, 23 to selectively correct intensity of portions of the beam of radiation 36 and form a corrected beam of radiation. The fingers may be individually controlled to modify the intensity of an illumination slit formed by the radiation beam 36 in order to achieve a target uniformity.

Referring again to FIG. 1, the amount of power output from the radiation source 1 may vary over time. A thermal state of one or more parts of the lithographic apparatus LA may vary over time. For example, during exposure of the substrate W, temperatures of one or more parts of the lithographic apparatus LA may increase. Between exposures, temperatures of one or more parts of the lithographic apparatus LA may decrease. Increasing the power of the radiation source 1 may increase a speed at which the lithographic apparatus LA can operate, and thereby increase the number of substrates W exposed by the lithographic apparatus LA per hour (which may be referred to as throughput). However, increasing the power of the radiation source 1 may increase the maximum temperatures reached by one or more parts of the lithographic apparatus LA, and may contribute to greater gradients of changes in temperature.

Changes in the temperature of one or more parts of the lithographic apparatus LA may cause unwanted changes in the intensity profile (e.g. a slit uniformity) of the radiation beam B. Unwanted changes in the intensity profile of the radiation beam B may result in lithographic errors, such as negatively influencing a critical dimension uniformity of the lithographic apparatus LA. For example, the facetted field mirror device 10 may receive heat from the radiation beam B during exposure of a substrate W and undergo a thermal deformation (e.g. thermally expand). Thermal deformation of the facetted field mirror device 10 may introduce an unwanted change in the intensity profile of the radiation beam B reflecting from the facetted field mirror device 10.

The control system 170 is configured to control the uniformity correction system 16 at least partially based on a thermal status criterion that is indicative of a thermal state of a part of the lithographic apparatus LA. The part of the lithographic apparatus LA may receive energy from the radiation beam B directly (e.g. through partial absorption of the radiation beam B). The part of the lithographic apparatus LA may receive energy from the radiation beam B indirectly (e.g. through the transfer of heat from one part of the lithographic apparatus to another). For example, additional uniformity corrections (e.g. in addition to the default uniformity corrections that are performed at the start of each substrate lot) may be triggered when the thermal status criterion (which is correlated to the thermal state of one or more parts of the lithographic apparatus LA) reaches or exceeds a reference thermal status criterion. The control system 170 thereby maintains a desired intensity profile of the radiation beam B despite a thermal drift of one or more parts of the lithographic apparatus LA. The control system 170 may cause the uniformity correction system 16 to perform additional uniformity corrections only when necessary to maintain a desired intensity profile of the radiation beam B. That is, the fewest number of additional uniformity corrections needed to maintain a desired slit uniformity may be triggered, thereby reducing lithographic errors whilst having a minimum impact on the throughput of the lithographic apparatus LA.

Many different parameters may contribute to the thermal status criterion. For example, the thermal status criterion may comprise a temperature of a part of the lithographic apparatus LA. The lithographic apparatus LA may comprise a sensing system configured to measure the temperature of one or more parts of the lithographic apparatus LA that receives heat from the radiation beam B. In the example of FIG. 1, the sensing system comprises four temperature sensors 201-204. A first temperature sensor 201 is configured to measure a temperature of the faceted field device 10 and/or a support structure configured to support the faceted field device 10. A second temperature senor 202 is configured to measure a temperature of the reticle-masking blade system 18. A third temperature sensor 203 is configured to measure the temperature of the support device MT that holds the reticle MA. A fourth temperature sensor 204 is configured to measure a temperature of a coolant 215 that forms part of a cooling system 210 configured to control a temperature of the faceted pupil mirror device 11. Each of these parts of the lithographic apparatus LA directly or indirectly receives heat generated by the radiation beam B. The temperatures measured by the temperature sensors 201-204 of the sensing system may be used as a thermal status criterion. For example, if one or more of the temperatures sensors 201-204 detects a temperature and/or a change in temperature that exceeds a pre-determined limit, the control system 170 may cause the uniformity correction system 16 to adjust an intensity profile of the radiation beam B to compensate for any associated thermal drift effects. The sensing system may comprise a greater or smaller number of temperature sensors 201-204. The sensing system may comprise other temperature sensors associated with other parts of the lithographic apparatus LA such as, for example, a coolant that forms part of another cooling system (not shown) configured to cool the faceted field device 10.

As another example, the thermal status criterion may comprise a parameter that is correlative to a temperature of a part of the lithographic apparatus LA that receives heat generated by the radiation beam B. The lithographic apparatus LA may comprise a measurement system configured to measure one or more parameters that are correlative to a temperature of a part of the lithographic apparatus LA. For example, the measurement system may be configured to measure a thermal deformation of a part of the lithographic apparatus LA that receives heat generated by the radiation beam B. The thermal deformation (e.g. thermal expansion and/or thermal contraction) of a part of the lithographic apparatus LA may correlate to unwanted changes in the intensity profile of the radiation beam B caused by thermal effects. Monitoring and/or predicting the thermal deformation of one or more parts of the lithographic apparatus LA may contribute to the thermal status criterion that is used to control the uniformity correction system 16.

In the example of FIG. 1, the measurement system comprises an alignment system comprising the faceted field device 10 and a sensor 220 configured to measure a position of a reflected portion of the radiation beam B at the faceted pupil mirror device 11. The alignment system may typically be used to determine an alignment between the radiation source SO and the illumination system IL. However, information generated by the alignment system may usefully contribute to the thermal status criterion used to control the uniformity correction system 16. For example, when the faceted field device 10 thermally deforms due to heat generated by the radiation beam B, a direction in which the faceted field device 10 reflects a portion of the radiation beam B may change. The sensor 220 may detect a corresponding change in the position of the portion of the radiation beam B at the facetted pupil mirror device 11. The greater the change in temperature of the faceted field device 10, the greater the change in direction of the portion of the radiation beam B, and the greater the change in the detected position of the radiation beam B by the sensor 220. Thus, the change in the position of the radiation beam B as measured by the sensor 220 correlates to the change in temperature of the faceted field device 10, which in turn correlates to an unwanted change in the intensity profile of the radiation beam B. Thus, measurements performed by the sensor 220 may be used by the control system 170 to cause the uniformity correction system 16 to adjust an intensity profile of the radiation beam B to account for the thermal deformations of the faceted field device 10. It will be appreciated that the measurement system is not limited to the faceted field device 10 and the faceted pupil mirror device 11. That is, other reflective surfaces may be used and/or introduced to the lithographic apparatus LA, and the sensor 220 may be located elsewhere in the lithographic apparatus LA.

Figure 3:
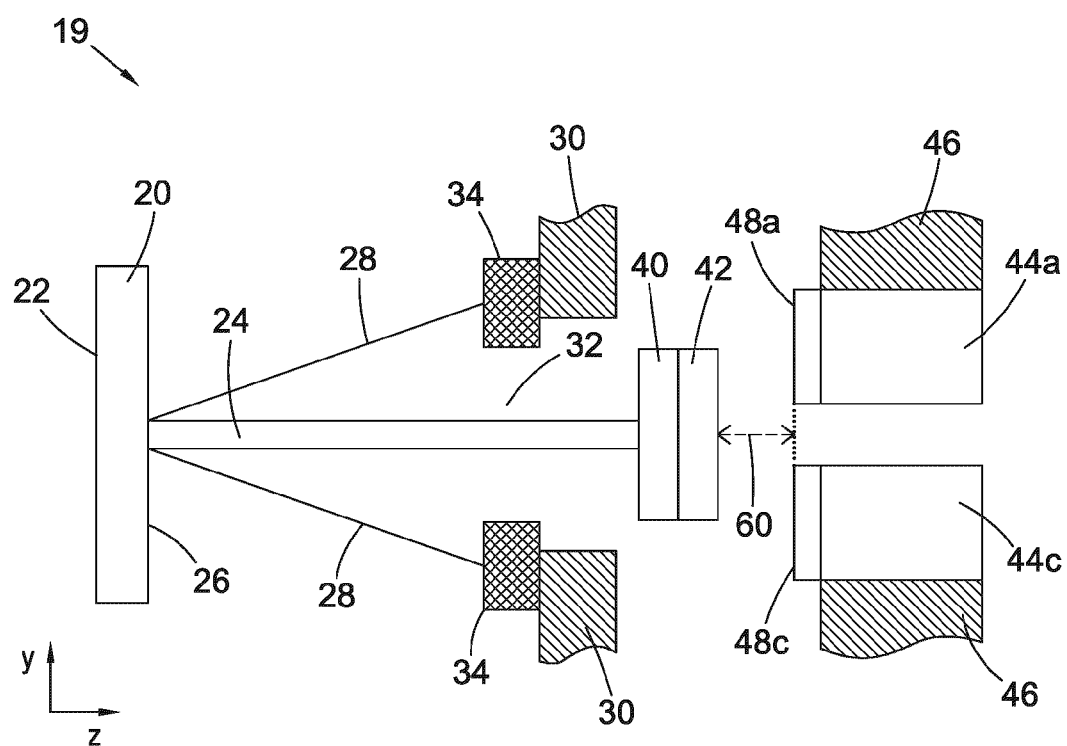
FIG. 3 schematically depicts a mirror assembly of a faceted field device.

The measurement system may be configured to measure a different parameter or additional parameters that are indicative of a thermal deformation of a part of the lithographic apparatus LA. FIG. 3 schematically depicts a mirror assembly 19 of the faceted field device 10 (which is an example of a mirror array). An outer surface 22 of the mirror 20 is reflective to EUV radiation, for example having a multi-layer structure formed from layers of alternating reflective indices. An arm 24 extends from a surface 26 of the mirror that is opposite to the reflective face 22. The surface 26 may be referred to as a rear surface of the mirror. The arm 24 is connected to the center of the rear surface 26 of the mirror (although it may be connected at some other point on the rear surface of the mirror). The connection between the arm 24 and the mirror 20 is rigid such that movement of the arm 24 causes movement of the mirror 20. Leaf springs 28 also extend from the rear surface of the mirror 20. A connector 34 receives the leaf springs 28 and is in turn connected to a support structure 30. Thus, the leaf springs 28 are connected, via the connector 34, to the support structure 30 and thereby support the mirror 20. The arm 24 is not connected to the support structure 30 but instead passes through an opening 32 in the support structure. Any number of leaf springs 28 may be provided. Other forms of connection may be provided. A different form of resilient connection may be provided (e.g. some other form of spring). Similarly, the connector may have some other shape and/or configuration. The connector 34 may be omitted.

The leaf springs 28 resiliently bias the mirror 20 and the arm 24 to an equilibrium orientation. The equilibrium orientation may correspond with the reflective surface 22 of the mirror 20 being substantially parallel to a surface of the support structure and corresponds to the arm 24 passing through the center of the opening 32 in the support structure. The leaf springs 28 may bias the mirror 20 to some other equilibrium orientation. A magnet 40 is located at the end of the arm 24. A layer of inductive material 42 may be provided on the magnet 40. The magnet 40 may be configured to allow force to be applied to the arm 24 in order to move the arm and mirror 20 to different orientations. The inductive material 42 may be configured to allow the orientation of the arm 24 (and mirror 20) to be measured. The magnet 40 and inductive material 42 may comprise any suitable materials. The magnet 40 and inductive material 42 may comprise a single material (e.g. ferrous material which is both magnetic and inductive).

Electromagnets 44a, 44c are supported by a second support structure 46. The second support structure 46 may be connected to the support structure 30 that supports the mirror 20 such that a single overall support structure is provided. The electromagnets 44a, 44c are separated in the y-direction. Two further magnets (not shown) may be provided and may be separated in the x-direction. Cartesian co-ordinates are used in this description for ease of understanding, and use the usual lithographic convention in which the direction of the radiation beam is the z-direction. The electromagnets 44a, 44c and the magnet 40 on the arm 24 are an example of a mirror actuator. Other forms of mirror actuator may be used, for example some other form of electromagnetic actuator, or a permanent magnet moved by a mechanical actuator. An eddy current sensor 48a, 48c is provided at the end of each electromagnet 44a, 44c. The eddy current sensors 48a, 48c are an example of a sensing apparatus. Other forms of sensing apparatus may be used. For example, the sensing apparatus may comprise an optical sensor arranged to measure the position and/or phase of a beam of radiation reflected from the surface of the magnet 40. A controller (not shown) delivers current to the electromagnets 44a, 44c to generate a magnetic field which applies a desired force to the magnet 40 and thereby moves the magnet to a desired position. This causes the arm 24 to rotate and moves the mirror 20 to a desired orientation. The controller may be used to control the orientations of the mirrors 20 of the array. The controller may receive measurements from the eddy current sensors 48a, 48c associated with the mirrors, and may use these measurements as feedback when controlling the current delivered to the electromagnets 44a, 44c.

The mirror assembly 19 depicted in FIG. 3 is part of an array of mirrors. The array of mirrors may be a faceted field mirror device 10 (as depicted in FIG. 1). In use, as mentioned further above, it may be desired to form a particular illumination mode at the faceted pupil mirror device 11. This can be achieved by selecting orientations of mirrors 20 of the faceted field mirror device 10 such that the radiation beam is directed towards particular desired locations at the faceted pupil mirror device 11. For example, the mirrors 20 may be oriented to direct radiation to two zones on the faceted pupil mirror device 11 to form a dipole mode, or may be oriented to direct radiation to four zones on the faceted pupil mirror device in order to form a quadrupole mode.

Although the mirror 20 reflects EUV radiation it is not a perfect reflector, but instead may reflect around 60% of incident EUV radiation. Thus, a substantial amount of EUV radiation is absorbed by the mirror 20 and causes heating of the mirror. The arm 24 may be formed of metal (e.g. steel, copper or an alloy) and is thermally connected to the mirror 20. The thermal connection between the arm 24 and the mirror 20 may be such that when the mirror is heated to a given temperature the arm is heated to substantially the same temperature. The arm 24 may have a length of several centimeters (e.g. between about five and about ten centimeters, e.g. around seven centimeters). The arm 24 may have a significant coefficient of thermal expansion. Therefore, as the arm 24 becomes hotter the arm undergoes thermal expansion. The thermal expansion of the arm 24 moves the magnet 40 and inductive material 42 towards the eddy current sensors 48a, 48c and the electromagnets 44a, 44c. Once the radiation beam is no longer incident on the mirror (e.g. between exposures of substrate and/or substrate lots), the arm 24 may reduce in temperature and undergo thermal contraction. The arm 24 is free to thermally expand and contract because it is not fixed to the support structure 30. Thermal expansion and/or contraction of the arm 24 alters a gap 60 between the magnet 40 and the eddy current sensors 48, 48c.

Thermal deformations of the faceted filed mirror device 10 may contribute to unwanted changes in the intensity profile of the radiation beam. Thermal deformations (e.g. expansion and/or contraction) of the arm 24 is determined by the temperature of the arm 24, which in turn may be determined by the temperature of the mirror 20. The temperature of the mirror 20 may be determined by the amount of energy from the radiation beam that is absorbed by the mirror. Measuring the thermal deformation of the arm 24 provides an output that may be indicative of the unwanted changes in the intensity profile of the radiation beam. Thermal expansion and/or contraction of the arm 24 may be measured by measuring a change of a separation between the inductive material 42 and the eddy current sensors 48a, 48c. This may be referred to as measuring a change of a gap 60 between the inductive material 42 and the eddy current sensors 48a, 48c. The gap 60 is indicated at a point between the eddy current sensors 48a, 48c and a dotted line is included to guide the eye. The gap 60 between the inductive material 42 and the eddy current sensors 48a, 48c may be measured using the eddy current sensors. Output signals from the eddy current sensors 48a, 48c may be used to measure the gap 60. The control system 170 may use the measured gap 60 as a thermal status criterion and control the uniformity correction system 16 in at least partial dependence on the measured gap 60. Output signals may be taken from a plurality of, or all of the sensor arrays that form the faceted field mirror device 10 and used as the thermal status criterion.

Figure 4A:
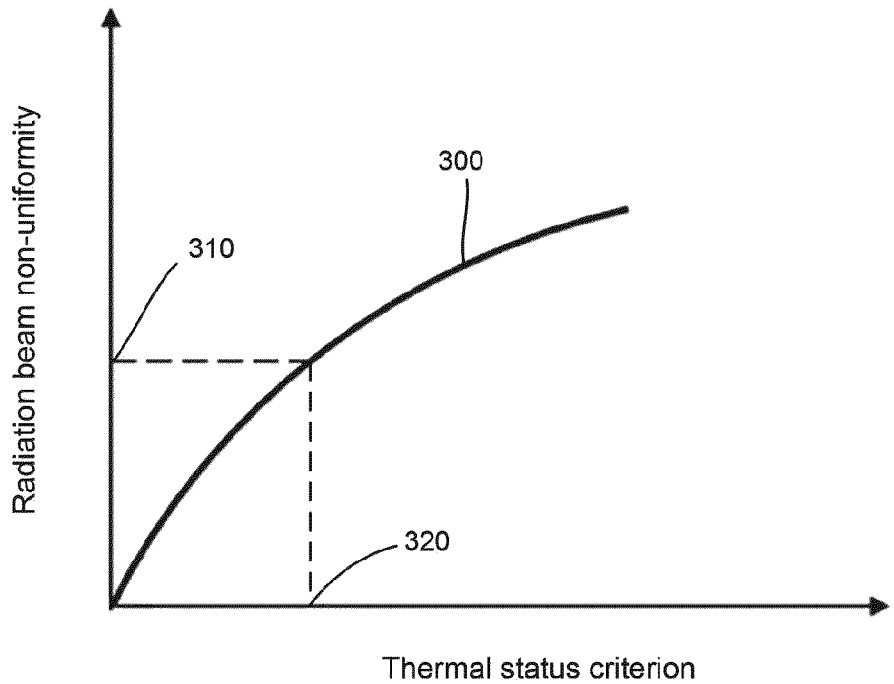
FIG. 4A shows a graph of the relationship between a thermal status criterion and a non-uniformity of an intensity profile of the radiation beam used by the lithographic apparatus in accordance with the present disclosure.

FIG. 4A shows a graph of the relationship between a thermal status criterion and a non-uniformity of an intensity profile of the radiation beam used by the lithographic apparatus. The thermal status criterion may comprise a monitored component such as, for example, a temperature (e.g. as measured by one or more of the temperature sensors 201-204 shown in FIG. 1) and/or a parameter that is correlative to a temperature (e.g. a thermal deformation measurement performed by the sensor 220 shown in FIG. 1 and/or the sensor apparatus 48a, 48c shown in FIG. 3). The thermal status criterion may additionally or alternatively comprise a predicted component. The predicted component may be determined at least partially based on pre-determined lithographic exposure information that indicates how much heat will be generated by the radiation beam during use of the lithographic apparatus. The lithographic exposure information may, for example, comprise radiation dose information (e.g. the amount of energy that is to be transferred to the substrate W and/or a substrate lot by the radiation beam B), radiation pulse information (e.g. the power and/or duration of pulses that form the radiation beam B), lithographic exposure duration, a number of substrates to be exposed, etc. Thermal characteristics (e.g. thermal expansion coefficients) of one or more parts of the lithographic apparatus may be known and used to model a thermal behavior of the lithographic apparatus.

A calibration may be performed to determine a relationship 300 between the uniformity of the radiation beam and the thermal status criterion. For example, a uniformity of the radiation beam may be measured and the thermal status criterion may be monitored throughout a lithographic exposure as the temperature of one or more parts of the lithographic apparatus changes. A limit (e.g. a maximum acceptable non-uniformity 310 of the radiation beam) may be pre-determined (e.g. based on a maximum acceptable change in critical dimension uniformity for a given pattern that is to be printed on a substrate). A reference thermal status criterion 320 that corresponds to the maximum acceptable non-uniformity 310 of the radiation beam may be provided to and/or saved in a memory of the control system 170 for reference during use of the lithographic apparatus LA. The control system 170 may be configured to control the uniformity correction system 16 at least partially based on a comparison between a thermal status criterion and the reference thermal status criterion 320.

For example, the thermal status criterion may comprise a predicted temperature of a part of the lithographic apparatus. The predicted temperature of the part of the lithographic apparatus may be modelled for a given lithographic exposure. For example, the predicted temperature of the part of the lithographic apparatus may be modelled using an exponential relationship, such as:

$$T = (T_2 - T_1) * \left(1 - \exp\left(1 - \frac{t}{\tau}\right)\right) + T_1$$

where $T_1$ is the temperature of the part of the lithographic apparatus at the start of time period t, $T_2$ is the temperature of the part of the lithographic apparatus at the end of time period t and $\tau$ is a thermal time constant. $T_2$ may represent the temperature of the part of the lithographic apparatus once a thermal equilibrium is reached for a given power input (e.g. radiation dose), and t may represent the time taken to reach the thermal equilibrium. A value of τ and a reference value of $T_2$ (e.g. the temperature reached by a given part of the lithographic apparatus after a nominal power input) may be determined, e.g. by a calibration measurement. It will be appreciated that the equation above represents a simple thermal model, and that more elaborate thermal modeling (e.g. thermal modelling software) may be used to predict a temperature of a part of the lithographic apparatus. A relationship between the temperature of the part of the lithographic apparatus and a radiation beam non-uniformity may be determined (e.g. the graph of FIG. 4A when the thermal status criterion is the temperature of the part of the lithographic apparatus). A reference temperature 320 that corresponds to the maximum acceptable non-uniformity 310 of the radiation beam may be determined. The thermal model may be used to predict when the reference temperature 320 will be reached, and thus when a dynamic uniformity correction event should be triggered.

Figure 4B:
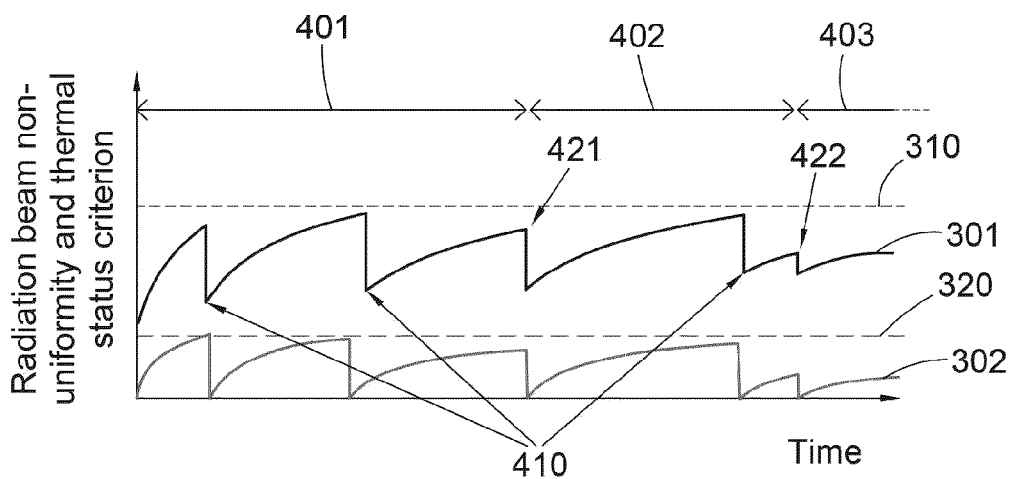
FIG. 4B shows a graph of a radiation beam non-uniformity and a thermal status criterion during the lithographic exposure of three substrate lots in accordance with the present disclosure.

FIG. 4B shows a graph of a radiation beam non-uniformity 301 and a thermal status criterion 302 during the lithographic exposure of three substrate lots 401-403. At the beginning of the exposure of the first substrate lot 401, the radiation beam non-uniformity 301 increases steeply due to the lithographic apparatus LA starting in a "cold" thermal state and heating quickly due to the presence of the radiation beam. The thermal status criterion 302 also increases steeply because the thermal status criterion is indicative of the thermal state of the lithographic apparatus and therefore correlates to the radiation beam non-uniformity 301. Once the thermal status criterion 302 reaches the reference thermal status criterion 320, a dynamic uniformity correction event 410 is triggered in which the control system causes the uniformity correction system to adjust the intensity profile of the radiation beam to reduce the non-uniformity of the radiation beam. The radiation beam non-uniformity 301 thereby stays below the maximum acceptable non-uniformity 310. The radiation beam non-uniformity 301 continues to rise but at a slower rate as the lithographic apparatus continues to heat up. The thermal status criterion 302 reaches the reference thermal status criterion 320 for a second time during the first substrate lot 401 and triggers another dynamic uniformity correction event 410 in which the control system causes the uniformity correction system to adjust the intensity profile of the radiation beam to reduce the non-uniformity of the radiation beam. The radiation beam non-uniformity 301 continues to rise but at a slower rate again as the lithographic apparatus approaches a new thermal equilibrium under the presence of heat generated by the radiation beam. Before the thermal status criterion 302 can reach the reference thermal status criterion 320 the first substrate lot 401 ends and a first static uniformity correction event 421 is triggered. A static uniformity correction event 421, 422 may be triggered at the end of each substrate lot 401-403 as standard. During the exposure of the second substrate lot 402 the thermal status criterion 302 reaches the reference thermal status criterion 320 at a slower rate again due to the increasing thermal stability of the lithographic apparatus. A dynamic uniformity correction event 410 is triggered in which the control system causes the uniformity correction system to adjust the intensity profile of the radiation beam to reduce the non-uniformity of the radiation beam. Before the thermal status criterion 302 can reach the reference thermal status criterion 320 again the second substrate lot 402 ends and a second static uniformity correction event 422 is triggered. Exposure of the third substrate lot 403 begins with the radiation beam non-uniformity 301 well below the maximum acceptable non-uniformity 310, and the thermal status criterion 302 well below the reference thermal status criterion 320. The rate of increase of the radiation beam non-uniformity and the thermal status criterion over time decreases as the lithographic apparatus reaches its new thermal equilibrium.

The process of FIG. 4B may be used for any desired thermal status criterion. The thermal status criterion may be continually monitored. Alternatively, the thermal status criterion may be determined at pre-determined intervals. For example, the thermal status criterion may be determined before the lithographic exposure of each substrate. A change in the thermal status criterion between each successive substrate may be determined. Once the change in thermal status criterion reaches a pre-determined limit, a dynamic uniformity correction event may be triggered at the earliest possible moment (e.g. before lithographic exposure of the next substrate) to keep the radiation beam uniformity at acceptable levels. After the dynamic uniformity correction event has occurred, the thermal status criterion may be measured again and used as a reference point for subsequent measurements of the thermal status criterion.

Figure 5:
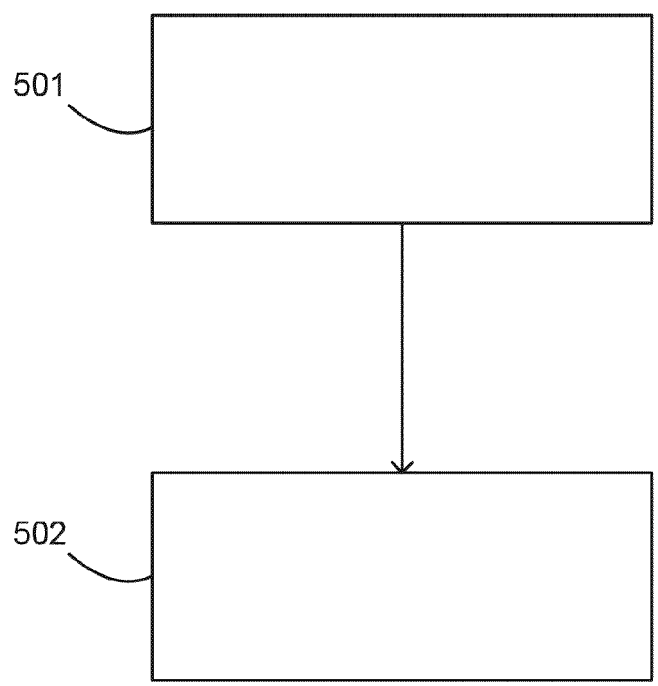
FIG. 5 shows a flowchart of a method of controlling a radiation beam for lithography in accordance with the present disclosure.

FIG. 5 shows a method of controlling a radiation beam for lithography. A first step 501 of the method comprises conditioning the radiation beam. The first step 501 may comprise providing the radiation beam with a desired cross-sectional shape and a desired intensity distribution. A second step 502 of the method comprises adjusting an intensity profile of the radiation beam at least partially based on a thermal status criterion that is indicative of heat generated by the radiation beam. The second step 502 may comprise spatially controlling an intensity profile of the radiation beam. The second step 502 may comprise selectively blocking portions of the radiation beam to selectively correct an intensity of portions of the radiation beam. The heat generated by the radiation beam may comprise energy absorbed from the radiation beam by one or more optical components used to condition the radiation beam.

In summary, the apparatus and method of the present disclosure allows the uniformity correction system to respond dynamically to evolving thermal conditions during operation of the lithographic apparatus, thereby reducing lithographic errors while keeping throughput impact to a minimum.

The present invention may also be summarized by the following clauses:

1. A lithographic apparatus comprising:
    an illumination system configured to condition a radiation beam;
    a uniformity correction system configured to adjust an intensity profile of the radiation beam; and,
    a control system configured to control the uniformity correction system at least partially based on a thermal status criterion that is indicative of a thermal state of a part of the lithographic apparatus.
2. The lithographic apparatus of clause 1, wherein the control system is configured to control the uniformity correction system at least partially based on a comparison between the thermal status criterion and a reference thermal status criterion.
3. The lithographic apparatus of clause 2, wherein the reference thermal status criterion comprises a pre-determined limit, and wherein the control system is configured to cause the uniformity correction system to adjust the intensity profile of the radiation beam when the thermal status criterion reaches the pre-determined limit.

4. The lithographic apparatus of any preceding clause, wherein the thermal status criterion comprises a predicted component.
5. The lithographic apparatus of clause 4, wherein the predicted component is calculated at least partially based on pre-determined lithographic exposure information.
6. The lithographic apparatus of any preceding clause, wherein the thermal status criterion comprises a monitored component.
7. The lithographic apparatus of clause 6, comprising a sensing system configured to measure a temperature of the part of the lithographic apparatus, wherein the monitored component comprises a measurement performed by the sensing system.
8. The lithographic apparatus of clause 7, comprising a cooling system configured to provide a flow of coolant for cooling the part of the lithographic apparatus, wherein the sensing system is configured to measure a temperature of the coolant.
9. The lithographic apparatus of clause 7 or clause 8, comprising:
    an optical element configured to interact with the radiation beam, and
    a support structure configured to support the optical element, wherein the sensing system is configured to measure a temperature of the optical element and/or the support structure.
10. The lithographic apparatus of any of clauses 7 to 9, comprising:
    a support device configured to hold a patterning device, the patterning device being configured to impart the radiation beam with a pattern in its cross-section to form a patterned radiation beam; and,
    a reticle-masking blade system configured to selectively block the patterned radiation beam, wherein the sensing system is configured to measure a temperature of the support device and/or the reticle-masking blade system.
11. The lithographic apparatus of any of clauses 6 to 10, comprising a measurement system configured to measure a thermal deformation of the part of the lithographic apparatus, wherein the monitored component comprises a measurement performed by the measurement system.
12. The lithographic apparatus of clause 11, wherein the measurement system comprises:
    a reflective surface configured to reflect at least a portion of the radiation beam and an arm which extends from a surface opposite to the reflective surface; and,
    a support frame provided with a sensing apparatus configured to measure a gap between the sensing apparatus and the arm, wherein the monitored component comprises the gap measured by the measurement system.
13. The lithographic apparatus of clause 11 or clause 12, wherein the measurement system comprises:
    a reflector configured to reflect at least a portion of the radiation beam;
    a sensor configured to measure a position of the reflected portion of the radiation beam, wherein the monitored component comprises the position of the reflected portion of the radiation beam measured by the measurement system.
14. The lithographic apparatus of any of clauses 6 to 13, wherein the monitored component comprises lithographic exposure information.
15. The lithographic apparatus of any preceding clause, wherein the control system is configured to use the thermal status criterion to control the uniformity correction system during a lithographic exposure of a substrate.
16. A method of controlling a radiation beam for lithography comprising:
    conditioning the radiation beam; and,
    adjusting an intensity profile of the radiation beam at least partially based on a thermal status criterion that is indicative of heat generated by the radiation beam.
17. The method of clause 16, comprising:
    comparing the thermal status criterion to a reference thermal status criterion; and,
    adjusting the intensity profile of the radiation beam at least partially based on the comparison.
18. The method of clause 17, wherein the reference thermal status criterion comprises a pre-determined limit, and wherein the method comprises adjusting the intensity profile of the radiation beam when the thermal status criterion reaches the pre-determined limit.
19. The method of any of clauses 16 to 18, wherein the thermal status criterion comprises a predicted component.
20. The method of clause 19, wherein the predicted component is calculated at least partially based on pre-determined lithographic exposure information.
21. The method of any of clauses 16 to 20, wherein the thermal status criterion comprises a monitored component.
22. The method of clause 21, wherein the monitored component comprises a temperature measurement and/or a thermal deformation measurement.
23. The method of clause 21 or clause 22, wherein the monitored component comprises lithographic exposure information.
24. The method of any of clauses 16 to 23, comprising:
    determining a relationship between the intensity profile of the radiation beam and the thermal status criterion;
    using the relationship to determine a reference thermal status criterion; and,
    adjusting the intensity profile of the radiation beam at least partially based on the reference thermal status criterion.
25. A method of projecting a patterned beam of radiation onto a substrate comprising the method of any of clauses 16 to 24.
26. A computer program comprising computer readable instructions configured to cause a computer to carry out a method according to any of clauses 16 to 25.
27. A computer readable medium carrying a computer program according to clause 26.
28. A computer apparatus comprising:
    a memory storing processor readable instructions; and
    a processor arranged to read and execute instructions stored in said memory;
    wherein said processor readable instructions comprise instructions arranged to control the computer to carry out a method according to any of clauses 16 to 25.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below. Each feature disclosed or illustrated in the present specification may be incorporated in any embodiments, whether alone or in any appropriate combination with any other feature disclosed or illustrated herein.

The invention claimed is:

1. A lithographic apparatus comprising:
   an illumination system configured to condition a radiation beam;
   a uniformity correction system configured to adjust an intensity profile of the radiation beam;
   a control system configured to control the uniformity correction system at least partially based on a thermal status criterion that is indicative of a thermal state of a part of the lithographic apparatus;
   a measurement system configured to measure a thermal deformation of the part of the lithographic apparatus, wherein the thermal status criterion comprises a monitored component and wherein the monitored component comprises a measurement performed by the measurement system;
   a sensing system configured to measure a temperature of the part of the lithographic apparatus, wherein the thermal status criterion comprises a monitored component and wherein the monitored component comprises a measurement performed by the sensing system; and
   a cooling system configured to provide a flow of coolant configured to cool the part of the lithographic apparatus, wherein the sensing system is configured to measure a temperature of the coolant.

2. The lithographic apparatus of claim 1, wherein the control system is configured to control the uniformity correction system at least partially based on a comparison between the thermal status criterion and a reference thermal status criterion.

3. The lithographic apparatus of claim 2, wherein the reference thermal status criterion comprises a pre-determined limit, and wherein the control system is configured to cause the uniformity correction system to adjust the intensity profile of the radiation beam when the thermal status criterion reaches the pre-determined limit.

4. The lithographic apparatus of claim 1, wherein the thermal status criterion comprises a predicted component.

5. The lithographic apparatus of claim 4, wherein the predicted component is calculated at least partially based on pre-determined lithographic exposure information.

6. The lithographic apparatus of claim 1, comprising:
   an optical element configured to interact with the radiation beam, and
   a support structure configured to support the optical element, wherein the sensing system is configured to measure a temperature of the optical element and/or the support structure.

7. The lithographic apparatus of claim 1, comprising:
   a support device configured to hold a patterning device, wherein the patterning device is configured to impart the radiation beam with a pattern in its cross-section to form a patterned radiation beam; and
   a reticle-masking blade system configured to selectively block the patterned radiation beam, wherein the sensing system is configured to measure a temperature of the support device and/or the reticle-masking blade system.

8. The lithographic apparatus of claim 1, wherein the measurement system comprises:
   a reflective surface configured to reflect at least a portion of the radiation beam and an arm that extends from a surface opposite to the reflective surface; and
   a support frame provided with a sensing apparatus configured to measure a gap between the sensing apparatus and the arm, wherein the monitored component comprises the gap measured by the measurement system.

9. The lithographic apparatus of claim 8, wherein the measurement system comprises:
   a reflector configured to reflect at least a portion of the radiation beam; and
   a sensor configured to measure a position of the reflected portion of the radiation beam, wherein the monitored component comprises the position of the reflected portion of the radiation beam measured by the measurement system.

10. The lithographic apparatus of claim 1, wherein the monitored component comprises lithographic exposure information.

11. The lithographic apparatus of claim 1, wherein the control system is configured to use the thermal status criterion to control the uniformity correction system during a lithographic exposure of a substrate.

12. A method of controlling a radiation beam of a lithography apparatus, the method comprising:
   conditioning the radiation beam;

adjusting an intensity profile of the radiation beam at least partially based on a thermal status criterion that is indicative of a thermal state of a part of the lithographic apparatus, wherein the thermal status criterion comprises a monitored component and wherein the monitored component comprises a thermal deformation measurement;

measuring, using a sensing system, a temperature of the part of the lithographic apparatus, wherein the monitored component comprises a measurement performed by the sensing system; and providing, using a cooling system, a flow of coolant to cool the part of the lithographic apparatus, wherein the sensing system is further configured to measure a temperature of the coolant.

13. The method of claim 12, comprising:

comparing the thermal status criterion to a reference thermal status criterion; and adjusting the intensity profile of the radiation beam at least partially based on the comparison.

* * * * *